USOO5825683A

United States Patent [19]
Chang

[11] Patent Number: 5,825,683
[45] Date of Patent: Oct. 20, 1998

[54] FOLDED READ-ONLY MEMORY

[75] Inventor: Ling-Yueh Chang, Hsin-Chu, Taiwan

[73] Assignee: Utron Technology Inc., Hsin-Chu, Taiwan

[21] Appl. No.: 959,892

[22] Filed: Oct. 29, 1997

[51] Int. Cl.$^6$ .................................................. G11C 17/00
[52] U.S. Cl. ...................... 365/104; 365/63; 365/185.13; 365/185.16
[58] Field of Search ..................................... 365/104, 103, 365/94, 185.16, 230.03, 63, 185.13

[56] References Cited

U.S. PATENT DOCUMENTS

| 5,117,389 | 5/1992 | Yiu | 365/104 |
| 5,268,861 | 12/1993 | Hotta | 365/104 |
| 5,295,092 | 3/1994 | Hotta | 365/51 |
| 5,341,337 | 8/1994 | Hotta | 365/204 |
| 5,392,233 | 2/1995 | Iwase | 365/104 |
| 5,600,586 | 2/1997 | Lee | 365/104 |
| 5,625,586 | 4/1997 | Yamasaki et al. | 365/104 |
| 5,721,698 | 2/1998 | Lee et al. | 365/104 |

Primary Examiner—David C. Nelms
Assistant Examiner—Hien Nguyen
Attorney, Agent, or Firm—H. C. Lin Patent Agent

[57] ABSTRACT

In a "flat cell" read-only memory with a matrix of memory cells, each memory cell is a MOSFET of either a low threshold voltage, which can be turned on when accessed, or a high threshold voltage which cannot be turned on when accessed. Each memory cell is connected between two adjacent columns of local bit lines. These local bit lines are alternately connected to a upper bank selection switch which is connected to a main bit line, and a lower bank selection switch, which is connected to a main virtual ground line. Since these local bit lines are fabricated with diffusion layers which are resistive, the path length, hence the resistance, to access any memory cell in the matrix from the main bit line to the main virtual ground is made the same by this alternate, interdigital local bit line layout. Thus, the access time is made uniform.

The layouts of two adjacent banks are mirrored, so that the bank selection switches of two adjacent banks can share a common selection line.

11 Claims, 6 Drawing Sheets

FOLDED READ-ONLY MEMORY

BACKGROUND OF THE INVENTION

1. Field of the Invention:

The invention relates to a read-only memory (ROM), particularly to high speed, high density ROM circuits.

2. Description of the Prior Art:

Conventional ROM uses a so-called "flat cell" design to achieve high density. The structure of a flat cell ROM is shown in FIG. 1a with a matrix of MOSFETs, such as M0, M1, M2, M3, serving as a memory cell. Each MOSFET memory cell is connected between two adjacent columns of local bit lines and is fabricated with either a low threshold voltage by not doping the substrate to be ON when selected or a high threshold voltage by heavily doping the substrate to be OFF even when selected. The word lines are fabricated with polycrystalline silicon (poly) or polycrystalline silicide (polycide) layers which are similar to that for the gate of the MOSFETs as shown in FIG. 1b. The local bit lines are fabricated with buried diffusion similar to that for the source and drain of the MOSFETs also as shown in FIG. 1b. Each memory cell is accessed from two adjacent local bit lines. The buried diffusion of the local bit lines has a relatively high resistance and parasitic capacitance, increases the access time of the memory cell, and causes degradation in the speed of the ROM. In order to reduce the series resistance and parasitic capacitance, the design usually partitions the bit lines with several banks and uses a hierarchical control selection.

FIG. 2 shows a kind of NOR type flat cell design. In this figure, the poly or polycide layers are represented by dotted lines. The memory cells for BANKi are laid out between the word lines WL0 and WLn. Bit lines are divided into several banks of local sub-bit lines, and connected by bank selection transistor (e.g. MS1, MS2) to the main bit lines (e.g. MBj) or main virtual ground lines (e.g. $VG_{j-1}$, $VG_j$) which are fabricated with metal layer to reduce resistance. When a bank is selected, the memory cells in that particular bank can be accessed. For instance, BANKi is selected when bank select word line BWL2 is high to close the switches MS1 and MS2. Then, the memory cell M0 can be accessed when the WL0 is high and the virtual ground line VGj-1 is activated. The Sense Amplifier is precharged to be High. If the cell M0 is ON (say in "1" logic level), the precharged node of the Sense Amplifier is pulled down; and if the cell M0 is OFF (say "0" logic level), the precharged node of the Sense Amplifier remains High.

The hierarchical control selection has another problem; i.e., the local hit line series resistance varies from position to position depending on the location of the memory cell in the bank. Thus, it is not easy to obtain an efficient design and uniformly high data read-out speed. For example in FIG. 3, if it is desired to read the data in memory cell M0, current flows through the main bit line to the bank selection transistor MS1, M0, then another bank selection transistor MS2 to the main virtual ground lines. If M0 has high threshold voltage, the current path is cut. If M0 has low threshold voltage, current flows through the virtual ground to the periphery ground. One can use these characteristic to distinguish memory bit data. Another case is to read out memory data in Mn. If the path is the same as M0 except that the path has twice the series local bit line resistance Rbs, then the access time to read the data in Mn is slower than the access time to read M0.

SUMMARY OF THE INVENTION

An object of this invention is to improve the structure of a flat cell ROM to equalize tire series and parasitic capacitance for uniformly high data read out speed. Another object of this invention is to provide high density ROM matrix for reducing chip area.

These objects are achieved by equalizing the resistive path length for accessing any particular memory cell in a matrix. One electrode of each memory cell is connected through a local bit line of diffusion layer and an upper bank selecting switch to a main bit line while the other electrode of the memory cell is connected through an adjacent local bit line and a lower bank selection switch to a main virtual ground fine. In so doing, the resistance from the main bit line to the main virtual line is made equal no matter where the memory is located. Different memory cells experience similar current flow path, no matter where the memory cell is located. The read out speed of different memory cell data is uniform and fast.

The layouts of two adjacent banks are mirrored, so that the bank selection switches two adjacent banks are grouped together. Then, every bank select word line can control two adjacent banks. This kind of layout saves area.

DETAILED DESCRIPTION OF THE PREFERRED EMBODIMENT

Figure 1:
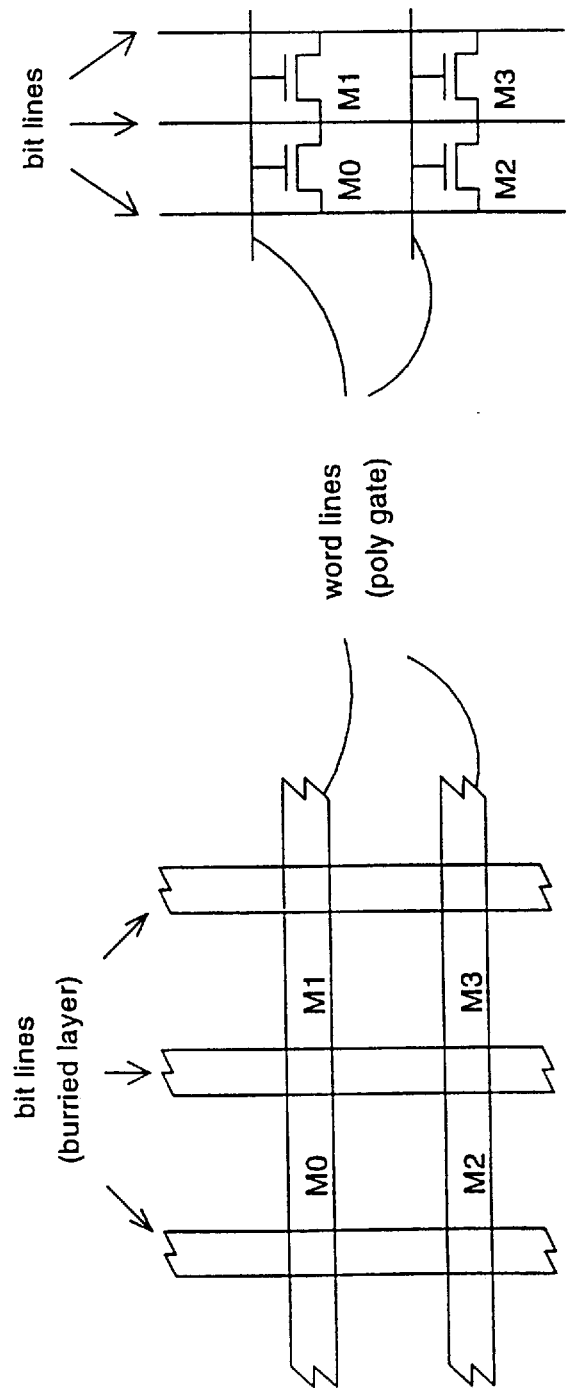
FIG. 1 shows a traditional flat cell ROM structure.
Figure 2:
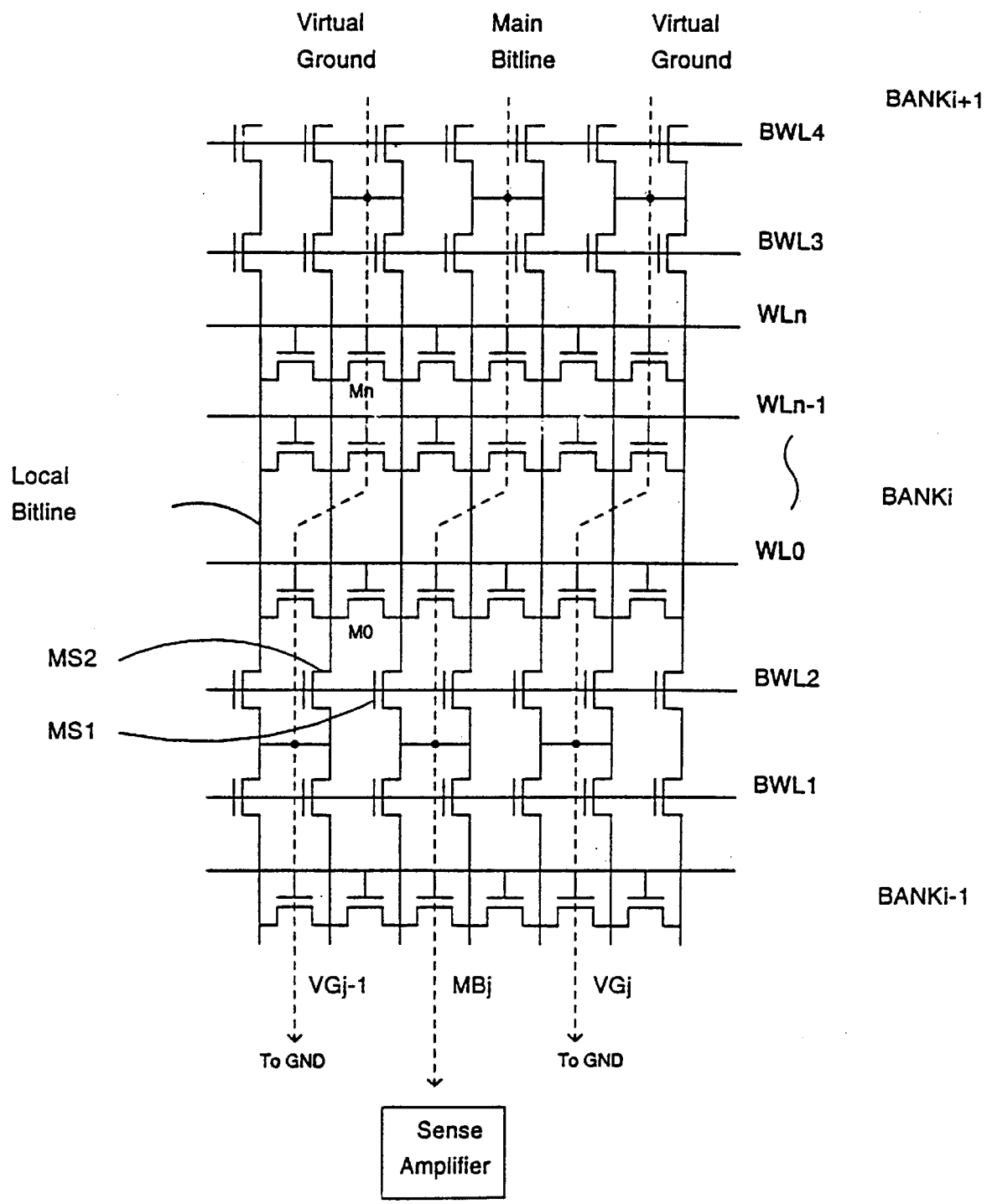
FIG. 2 shows a hierarchical layout example using NOR type flat cells.
Figure 3:
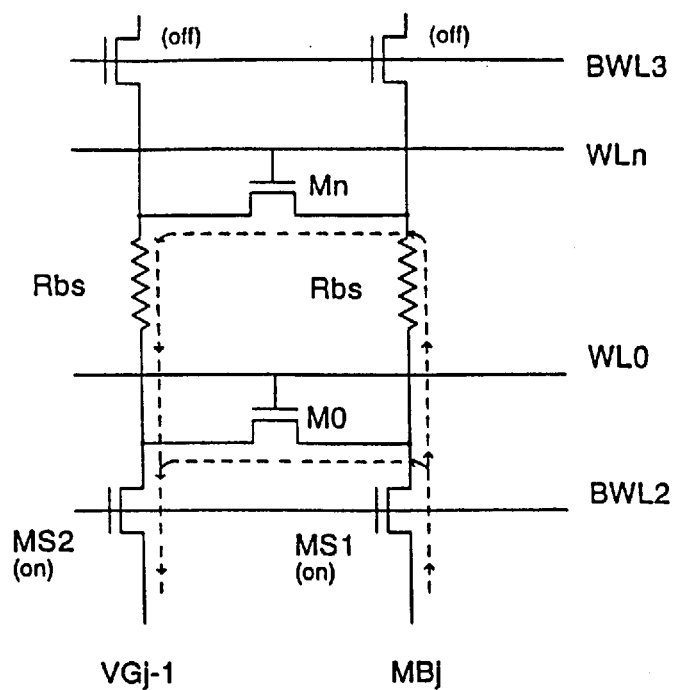
FIG. 3 shows the critical current path of FIG. 2.
Figure 4:
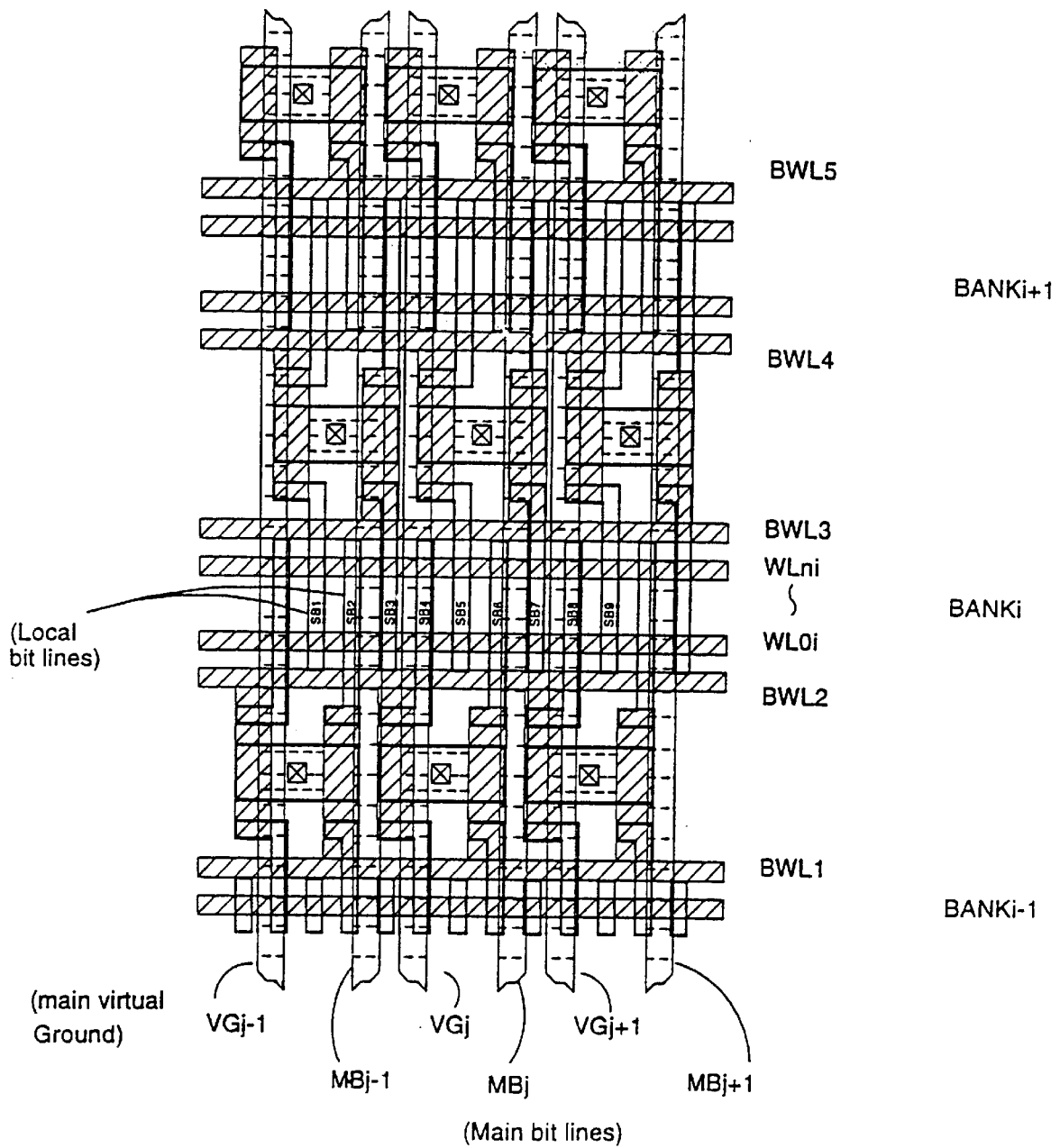
FIG. 4 shows a layout example according to the present invention.
Figure 5:
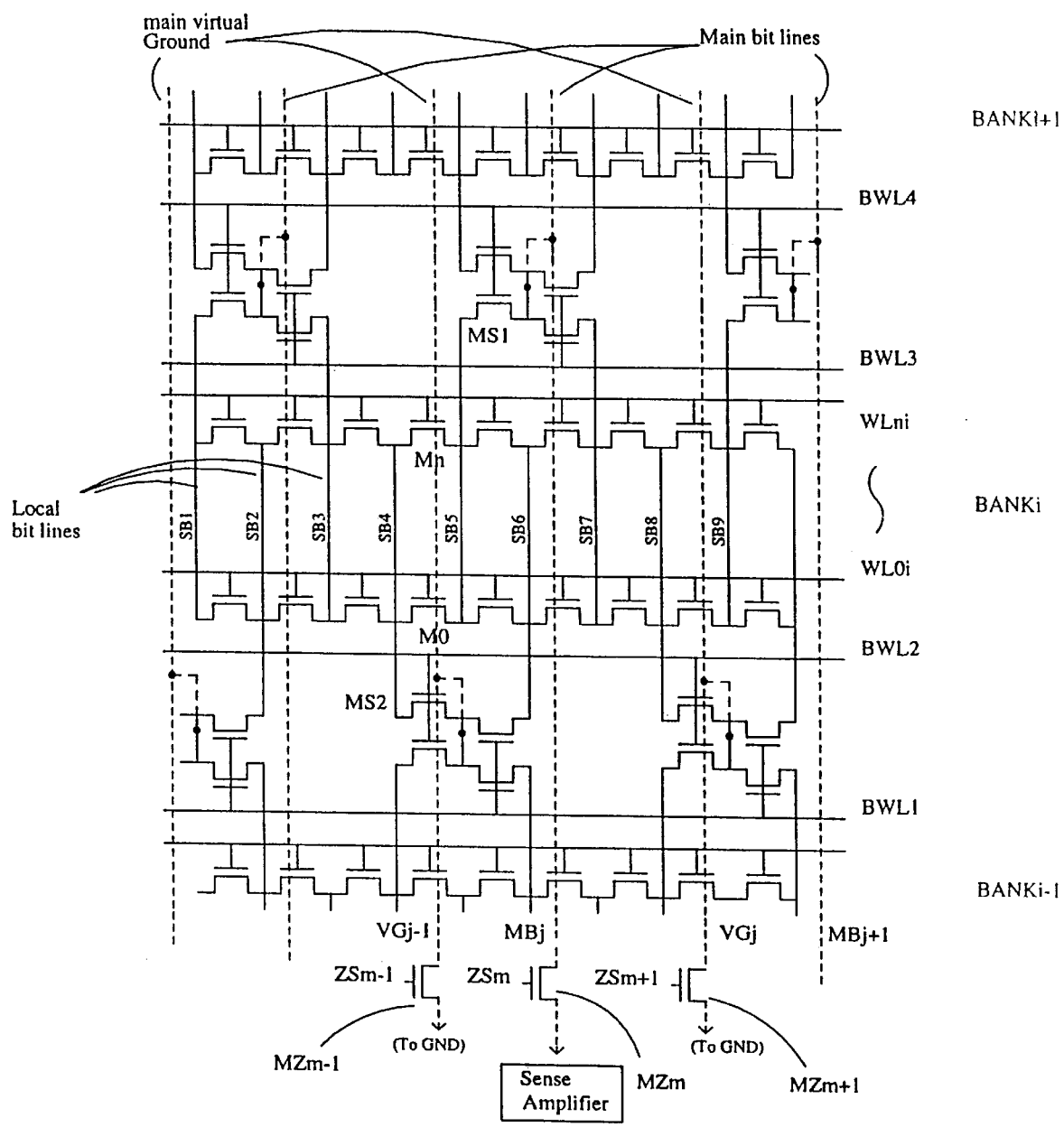
FIG. 5 shows an equivalent circuit of the present invention.

In the present invention, one part of the layout pattern is shown in FIG. 4, and its schematic diagram is shown in FIG. 5, where MBj-1, MBj, MBj+1 are main bit lines; VGj-1, VGj, VGj+1 are main virtual ground lines; SB1 to SB9 are local bit lines. BWL1 to BWL6 are bank selecting word lines; WL0i to WLni are word lines and ZSm-1, ZSm, ZSm+1 are Z decoder control signal.

The basic MOSFET memory cell source and drain are formed between two adjacent local bit lines, which are fabricated by buried diffusion layer. The gates are connected to word lines which are fabricated with a poly or polycide layer. When one pair of bank selecting word line signals are activated, the main bit line signal can pass through the memory cell to the main virtual ground line. For instance, when the bank selection MOSFET MS1 is turned on by BWL4, MS2 is turned on by BWL2, and MZm-1 is turned on by a signal ZSm-1, the memory cell M0 is accessed. If M0 is ON, current flows from a main bit line through MS1, sub-bit line SB5, M0, sub-bit line SB4, MS2, MZm-1 to ground and pulls down the main bit line MBj down to send a low signal (say "0") to the Sense Amplifier through MOSFET MZm, provided MBj is turned on by the decoder control signal ZSm. If M0 is OFF, the current path is not continuous and the sub-bit line SB5 is precharged to a high voltage. ("1" level).The main bit line is connected to many banks of memory cells through a Z decoder to the sense amplifier. The main virtual ground line is also connected to many banks of memory cells through decoder transistor such as MZm-1. The main virtual ground lines and the main bit lines are placed in alternate columns.

Every bank has two bank selecting word lines which control two adjacent banks. In each access cycle, only two bank selecting word lines are activated to select only one bank and one column of memory cells. When one word line of the selected bank such as WL0I is activated, only one memory cell is selected and read out. As an example, when BANKi is selected, the possible current paths from the main bit line to the virtual ground line and the selected cells between two local sub-bit lines are tabulated as follows:

| BWL1 | BWL2 | BWL3 | BLW4 | Selected cells between 2 sub-bit lines | Main bit line to main virtual ground |
|------|------|------|------|----------------------------------------|--------------------------------------|
| 0    | 1    | 0    | 1    | SB4–SB5                                | MBj-VGj-1                            |
| 1    | 0    | 0    | 1    | SB5–SB6                                | MBj-VGj-1                            |
| 1    | 0    | 1    | 0    | SB6–SB7                                | MBj-VGj-1                            |
| 0    | 1    | 1    | 0    | SB7–SB8                                | MBj-VGj                              |

For example, if the data in M0 is to be accessed, word line WL0I is activated and word lines WL1to Wlni is not activated. Meanwhile, Bank selection switches BWL2 and BWL4 are activated while other bank selection switches are not activated. Then the memory cell M0 connects one end through SB4 and MS2 to the virtual ground VGj–1, and connects the other end through SB5 and MS1 to the main bit line MBj. When ZSm is activated and ZSm1 is not activated, current from the Sense Amplifier flows through MZm, main bit line MBj, MS1 to sub-bit line SB5. If M0 is implanted to have a low threshold voltage, current flows through M0, sub-bit line SB4, MS2, virtual ground VGj–1, MZm–1 to periphery ground. The Sense Amplifier can sense this current flow and read the state ("0") of the memory cell. On the other hand if M0 is doped to have a high threshold voltage, current cannot flow through the memory cell M0, and the Sense Amplifier can sense this memory to be in "1" state.

Figure 6:
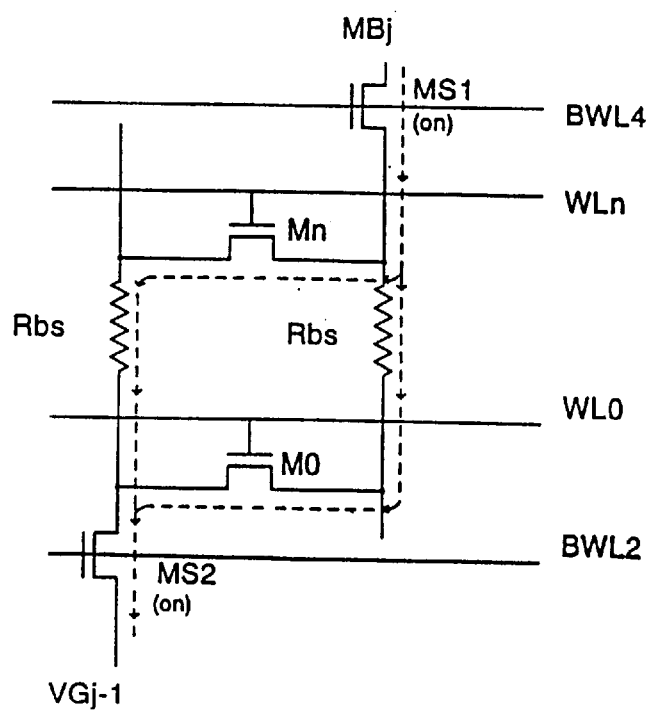
FIG. 6 shows the critical current path of FIG. 5.

From FIG. 6, it can be seen that when memory cell M0 is accessed, the current path encounters a diffusion resistance Rbs between MS1 and M0. If Mn is accessed, the current path from Mn to MS2 also encounters a resistance Rbs between Mn and MS2. Thus the resistance in series with both memory cells M0 and Mn is the same. Thus the access times for both M0 and Mn are the same, and a uniform access time can be achieved for all memory cells.

Another layout feature of this invention is that each bank selection word line BWL1 or BWL2 controls two Banks, BANKi–1 and BANKi. This is made possible by mirroring the layouts of these two banks, so that the bank selection transistors such as MS2 of both banks are grouped together to share the same bank selection word lines BWL1 and BWL2 for connection to one of the main virtual ground lines. Thus this kind of layout saves chip area.

Thus, this invention can not only can achieve uniform and high speed, but also reduce vertical layout pitch and area. This invention is also applicable to other kinds of read-only memory, e.g. EPROM or EEPROM.

While the preferred embodiment of the invention has been shown and described, it will be apparent to those skilled in this art that various modifications may be made in the embodiment without departing from the spirit of the present invention. Such modifications are all within the scope of this invention.

What is claimed is:

1. A read-only memory, comprising:
    a plurality of main bit lines;
    a plurality of main virtual ground lines;
    a plurality of banks of memory cells arranged in a matrix;
    a first plurality of bank selection switches connected second alternate columns of local bits lines of said matrix and interleaved between said first alternate columns, to select together only one of said banks to be activated;
    each one of said memory cells comprising a MOSFET connected between two adjacent columns of said local bit lines and having a low threshold to be conductive when accessed by not doping the substrate of said MOSFET and a high threshold voltage to be non-conductive when accessed by heavily doping the substrate of said MOSFET,
    the gates of said memory cells on a same row being connected together to one of a plurality word lines,
    only one of said memory cells being accessed when one of said word lines and two adjacent local bit lines are activated,
    one of said two adjacent local bit lines being selected through one of said first plurality of bank selection switches to one of said main bit lines, and the other of said two adjacent local bit lines being selected through one of said second plurality of bank selection switches to one of said virtual ground lines,
    wherein the layout of one bank of memory cells has a mirror layout of an adjacent bank so that said first plurality of bank selection switches of one bank and the first plurality of selection switches of an second bank are grouped together.

2. A read-only memory as described in claim 1, wherein said main bit line and said main virtual ground lines are interleaved columns.

3. A read-only memory as described in claim 2, wherein said word lines are fabricated with polycrystalline silicon.

4. A read-only memory as described in claim 2, wherein said word lines are fabricated with polycrystalline silicide.

5. A read-only memory as described in claim 1, wherein said local bit lines are fabricated with diffusion of impurities into a silicon substrate.

6. A read-only memory as described in claim 1, wherein each of said main bit lines is shared by two local bit lines, and each of main virtual ground lines is shared by two local bit lines.

7. A read-only memory as described in claim 1, wherein said first plurality of bank switches are controlled by another common bank selection word line.

8. A read-only memory as described in claim 7, wherein said common bank selection word line controls the first plurality of bank switches of two adjacent bank.

9. A read-only memory as described in claim 1, wherein said main bit lines and said main virtual ground line are fabricated with metal.

10. A read-only memory as described in claim 7, wherein said common bank word line is fabricated with polycrystalline silicon layer.

11. A read-only memory as described in claim 7, wherein said common bank word line is fabricated with polycrystalline silicide.

* * * * *